United States Patent
Kim et al.

(10) Patent No.: US 10,242,243 B2
(45) Date of Patent: Mar. 26, 2019

(54) FINGERPRINT SENSOR HAVING PRINTED CIRCUIT BOARD AND METHOD OF MANUFACTURE

(71) Applicant: SAMSUNG ELECTRO-MECHANICS CO., LTD., Suwon-si (KR)

(72) Inventors: Woon-Chun Kim, Suwon-si (KR); Ga-Young Yoo, Suwon-si (KR); Hyung-Mi Jung, Suwon-si (KR); Hyun-Chul Jung, Yongin-si (KR); Jeong-Bok Kwak, Suwon-si (KR); Ji-Hye Shim, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 144 days.

(21) Appl. No.: 15/226,238

(22) Filed: Aug. 2, 2016

(65) Prior Publication Data

US 2017/0098110 A1    Apr. 6, 2017

(30) Foreign Application Priority Data

Oct. 6, 2015    (KR) .................. 10-2015-0140417

(51) Int. Cl.
| | |
|---|---|
| *G06K 9/00* | (2006.01) |
| *H01L 21/48* | (2006.01) |
| *H01L 23/498* | (2006.01) |

(52) U.S. Cl.
CPC ....... *G06K 9/0002* (2013.01); *G06K 9/00053* (2013.01); *H01L 21/4857* (2013.01); *H01L 23/49822* (2013.01); *H01L 23/49838* (2013.01); *H01L 23/49894* (2013.01)

(58) Field of Classification Search
CPC .............. G06K 9/0002; G06K 9/00053; H01L 21/4857; H01L 23/49822; H01L 23/49838; H01L 23/49894
See application file for complete search history.

(56) References Cited

U.S. PATENT DOCUMENTS

| | | | | |
|---|---|---|---|---|
| 3,611,225 A | * | 10/1971 | Dakin ................... | H01F 27/327 336/58 |
| 4,996,132 A | * | 2/1991 | Tazawa ................... | G03F 7/032 430/280.1 |
| 5,325,442 A | * | 6/1994 | Knapp ................... | G01B 7/004 361/278 |
| 5,464,662 A | * | 11/1995 | Murakami ............. | H05K 1/111 427/259 |

(Continued)

FOREIGN PATENT DOCUMENTS

| | | | | |
|---|---|---|---|---|
| JP | 01270389 | A | * | 10/1989 |
| JP | 05210883 | A | * | 8/1993 |

(Continued)

*Primary Examiner* — Yubin Hung
(74) *Attorney, Agent, or Firm* — NSIP Law

(57) ABSTRACT

A fingerprint sensor includes a first conductive pattern formed on one side of a core, a second conductive pattern formed on the first conductive pattern, an insulating layer formed between the first conductive pattern and the second conductive pattern, a dielectric layer configured to cover the second conductive pattern, and a protective layer covering the dielectric layer, wherein the protective layer includes a photosetting resin.

6 Claims, 3 Drawing Sheets

(56) References Cited

U.S. PATENT DOCUMENTS

| | | | | |
|---|---|---|---|---|
| 5,484,627 A * | 1/1996 | Jang | G02F 1/1347 | 427/162 |
| 6,239,027 B1 * | 5/2001 | Wu | H01L 21/31116 | 257/E21.008 |
| 6,349,027 B1 * | 2/2002 | Suhara | H01G 9/02 | 361/502 |
| 6,405,431 B1 * | 6/2002 | Shin | H05K 3/0038 | 205/126 |
| 6,671,031 B1 * | 12/2003 | Nishimura | G02B 5/3016 | 349/187 |
| 2003/0044588 A1 * | 3/2003 | Komoto | C08G 75/0286 | 428/209 |
| 2003/0161512 A1 * | 8/2003 | Mathiassen | G06K 9/0002 | 382/124 |
| 2004/0148766 A1 * | 8/2004 | Noguchi | H05K 3/4655 | 29/830 |
| 2006/0121256 A1 * | 6/2006 | Kim | H05K 3/205 | 428/209 |
| 2009/0266582 A1 * | 10/2009 | Sakurai | H05K 3/207 | 174/250 |
| 2010/0031502 A1 * | 2/2010 | Cheng | H05K 3/0038 | 29/852 |
| 2010/0270645 A1 * | 10/2010 | McGregor | H05K 1/162 | 257/532 |
| 2011/0198762 A1 * | 8/2011 | Scanlan | H01L 21/568 | 257/793 |
| 2011/0304001 A1 * | 12/2011 | Erhart | G06K 9/00053 | 257/433 |
| 2012/0064689 A1 * | 3/2012 | Hirota | H01L 21/02178 | 438/381 |
| 2013/0266813 A1 * | 10/2013 | Faulkner | C09J 133/08 | 428/418 |
| 2014/0341448 A1 * | 11/2014 | Chiu | G06K 9/0002 | 382/124 |
| 2015/0028474 A1 * | 1/2015 | Jang | H01L 23/3128 | 257/737 |
| 2015/0030217 A1 * | 1/2015 | Wickboldt | G06K 9/00026 | 382/124 |
| 2015/0071502 A1 * | 3/2015 | Breznicky | G06K 9/00885 | 382/115 |
| 2015/0102829 A1 * | 4/2015 | Son | G06K 9/00053 | 324/692 |
| 2016/0004899 A1 * | 1/2016 | Pi | G06F 1/1626 | 345/173 |
| 2016/0026846 A1 * | 1/2016 | Lin | G06K 9/0002 | 382/124 |
| 2016/0042217 A1 * | 2/2016 | Kim | G06F 3/041 | 382/124 |
| 2016/0099232 A1 * | 4/2016 | Hatori | H01L 25/0657 | 257/778 |

FOREIGN PATENT DOCUMENTS

| | | | |
|---|---|---|---|
| JP | 05210883 A | * | 8/1993 |
| KR | 10-2014-0052539 A | | 5/2014 |

* cited by examiner

FINGERPRINT SENSOR HAVING PRINTED CIRCUIT BOARD AND METHOD OF MANUFACTURE

CROSS-REFERENCE TO RELATED APPLICATIONS

This application claims the benefit under 35 USC § 119(a) of Korean Patent Application No. 10-2015-0140417, filed with the Korean Intellectual Property Office on Oct. 6, 2015, the entire disclosure of which is incorporated herein by reference for all purposes.

BACKGROUND

1. Field

The following description relates to a fingerprint sensor having a printed circuit board and a method of manufacturing the printed circuit board.

2. Description of Related Art

Fingerprint sensors, which sense fingerprints of users, have been not only used popularly in digital door locks but also used recently in turning on or off electronic apparatuses, such as mobile devices or smart phones, or waking up the electronic apparatuses from a sleep mode.

Particularly, the recently swipe types of fingerprint sensors having a small size, can sense fingerprints, have been applied to a growing number of portable electronic apparatuses. The fingerprint sensors may be an ultrasonic type, infrared type, or capacitance type, based on their operating principles.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a fingerprint sensor includes a first conductive pattern formed on one side of a core, a second conductive pattern formed on the first conductive pattern, an insulating layer formed between the first conductive pattern and the second conductive pattern, a dielectric layer configured to cover the second conductive pattern, and a protective layer covering the dielectric layer, wherein the protective layer includes a photosetting resin.

The dielectric layer may include an insulating resin and organic fillers dispersed in the insulating resin. The insulating resin may be a thermosetting resin. The thermosetting resin may be an epoxy. The organic fillers may include barium titanate ($BaTiO3$), silica ($SiO2$), lead zirconate titanate ($Pb[ZrXTi1-X]O3$) or lead titanate ($PbTiO3$), or any combination thereof. The photosetting resin may be a urethane acrylate.

The fingerprint sensor may further include a third conductive pattern formed on another side of the core and a via formed in the core connecting the first conductive pattern and/or the second conductive pattern with the third conductive pattern. The third conductive pattern may include a first connection pad and a second connection pad. The fingerprint sensor may further include an IC chip coupled to the first connection pad and a solder resist layer formed on a portion of the second connection pad.

The fingerprint sensor may further include a color layer formed on the protective layer, and an adhesive layer formed between the protective layer and the color layer adhering the protective layer to the color layer. The adhesive layer may include carbon black and/or iron oxide.

The first conductive pattern may extend perpendicularly to the second conductive pattern. The first conductive pattern, the second conductive pattern, the insulating layer, and the dielectric layer may be configured to generate a first capacitance in response to contacting a ridge of a fingerprint and a second capacitance in response to contacting a groove of the fingerprint.

In another general aspect, a method of manufacturing a fingerprint sensor includes forming a first conductive pattern, a third conductive pattern and a via on a core, forming an insulating layer on the first conductive pattern, forming a second conductive pattern on the insulating layer, forming a dielectric layer on the second conductive pattern, forming a protective layer the second conductive pattern, and forming a solder resist layer on the third conductive pattern.

The forming of the solder resist layer may include forming a dielectric film in B-stage on the second conductive pattern, forming a photosetting film in B-stage on the dielectric film, coating a solder resist film on the third conductive pattern, exposing the solder resist film and the photosetting film, and heat-curing the dielectric film.

The method of may further include, after the forming of the solder resist layer, forming an adhesive layer and a color layer successively on the protective layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
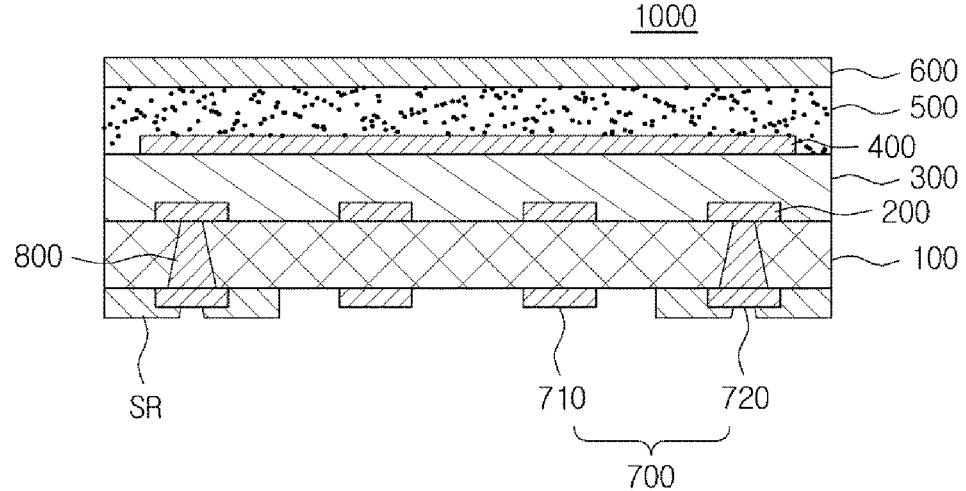
FIG. 1 illustrates an example of a printed circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Figure 2:
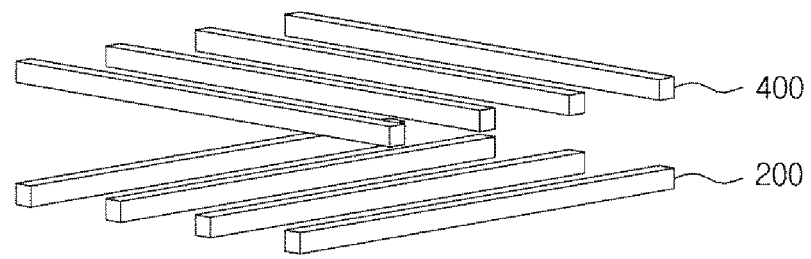
FIG. 2 is an illustration of a first conductive pattern and a second conductive pattern applied in an example of a printed circuit board.
Figure 3:
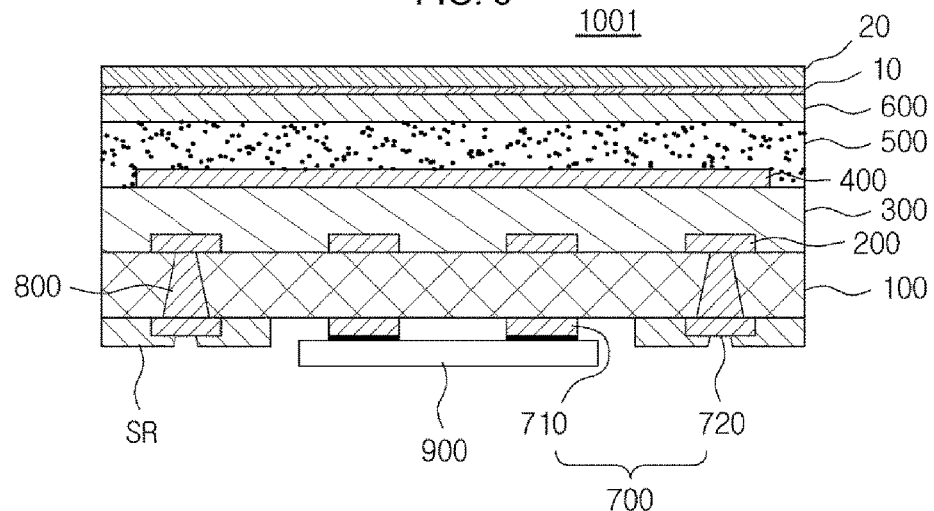
FIG. 3 illustrates an example of a printed circuit board with a post-treatment layer formed thereon.

FIG. 1 illustrates an example of a printed circuit board. FIG. 2 is a brief illustration of a first conductive pattern and a second conductive pattern applied in an example of a printed circuit board. FIG. 3 illustrates an example of a printed circuit board with a post-treatment layer formed thereon that may be used for a fingerprint sensor.

Referring to FIG. 1 to FIG. 3, a printed circuit board 1000 in accordance with an example fingerprint sensor includes a core 100, a first conductive pattern 200, an insulating layer 300, a second conductive pattern 400, a dielectric layer 500, a protective layer 600, a third conductive pattern 700 and a via 800. The core 100 may also have a ground layer formed therein. The printed circuit board of FIG. 3 further include an adhesive layer 10 and a color layer 20.

The core 100 may be made of a core material of a common printed circuit board. That is, the core 100 may be formed using a prepreg having glass fiber impregnated in an insulating resin or may be formed using a metal plate. In the case of the latter, an insulating film may be formed in between the core 100 and each of the first conductive pattern 200, the third conductive pattern 700 and the via 800.

Referring to FIG. 1, the first conductive pattern 200 is formed on one surface of the core 100 adjacent to a contact surface of the fingerprint sensor. The first conductive pattern 200 recognizes a fingerprint of a user in conjunction with the second conductive pattern 400. This will be further described below.

The first conductive pattern 200 is an electrically conductive material. For example, the first conductive pattern 200 may be made of, but not limited to, copper (Cu), or any of various electrically conductive materials, such as nickel (Ni) and aluminum (Al).

The insulating layer 300 is formed between the first conductive pattern 200 and the second conductive pattern 400. The insulating layer 300 insulates the first conductive pattern 200 electrically from the second conductive pattern 400. The insulating layer 300 may be formed using, but not limited to, a prepreg having glass fiber impregnated in an insulating resin or a build-up film having inorganic fillers contained in an insulating resin. In other words, any electrically conductive material may be used to form the insulating layer 300 of the present disclosure.

The second conductive pattern 400 is formed above the first conductive pattern 200. Specifically, the second conductive pattern 400 is formed on the insulating layer 300. The insulating layer 300 is formed on and covers the first conductive pattern 200.

The second conductive pattern 400 is an electrically conductive material. For example, the second conductive pattern 400 may be made of, but not limited to, copper (Cu), or any of various electrically conductive materials, such as nickel (Ni) and aluminum (Al). The second conductive pattern 400 recognizes the fingerprint of a user in conjunction with the first conductive pattern 200. This will be further described below in reference to FIG. 2, which illustrates an arrangement of the first conductive pattern 200 relative to an arrangement of the second conductive pattern 400. For the convenience of description and illustration, the insulating layer 300 and the other layers of the core are omitted from FIG. 2.

Referring to FIG. 2, the first conductive pattern 200 and the second conductive pattern 400 of the printed circuit board 1000 are formed perpendicularly to one another. The first conductive pattern 200 and the second conductive pattern 400 are electrically isolated from each other with the insulating layer 300 in the middle thereof (see FIG. 1). Once different electric charges are applied to the first conductive pattern 200 and the second conductive pattern 400, respectively, a circuit comprising the first conductive pattern 200, the insulating layer 300, the dielectric layer 500, the protective layer 600, ridges and grooves of a fingerprint, the dielectric layer 500 and the second conductive pattern 400 is formed and generates a capacitance. Here, since the fingerprint of the user has ridges and grooves, a route of the circuit through the grooves has a different capacitance value from that of a route of the circuit through the ridges. The fingerprint of the user may be recognized using this principle.

The dielectric layer 500 includes insulating resin and organic fillers dispersed in the insulating resin and is formed on the second conductive pattern 400 so as to cover the second conductive pattern 400. The dielectric layer 500 may contain a material having a high dielectric constant to improve a sensitivity by maximizing a difference in capacitance between the ridges and the grooves of a fingerprint. The insulating resin may be a thermosetting resin such as a polymer epoxy. Moreover, the organic fillers may include barium titanate (BaTiO3), silica (SiO2), lead zirconate titanate (Pb[ZrXTi1-X]O3) or lead titanate (PbTiO3), or any combination thereof. However, the present disclosure is not restricted to the above examples of materials.

The protective layer 600 may include a photosetting resin and formed on the dielectric layer 500 in order to protect the dielectric layer 500. That is, by being formed on the dielectric layer 500, which may include a thermosetting resin, the protective layer 600 is hardened during an exposure process for forming a solder resist layer, which will be described later, to protect the dielectric layer 500, which is in an unhardened state. The photosetting resin may be a polymer in the urethane acrylate group but may include a photopolymerized polymer in another group and a photo initiator.

The third conductive pattern 700 is formed on the other surface of the core 100 and includes a first connection pad 710 and a second connection pad 720. The printed circuit board 1000 for a fingerprint sensor may be coupled with an integrated circuit (IC) chip 900 through the first connection pad 710 and with a substrate for a package through the second connection pad 720. Therefore, the printed circuit board is configured to receive, or be disposed on, an IC chip and/or substrate package.

The third conductive pattern 700 is made of an electrically conductive material. For example, the third conductive pattern 700 may be made of, but not limited to, copper (Cu), or any of various electrically conductive materials, such as nickel (Ni) and aluminum (Al), or any combination thereof.

Although FIG. 1 illustrates the first conductive pattern 200 and the third conductive pattern 700 protruding from respective surfaces of the core 100, the first conductive pattern 200 and/or the third conductive pattern 700 may be embedded in the one surface and/or the other surface of the core 100. The term "core" is used herein to refer to the first conductive pattern 200 and the third conductive pattern 700 formed about a substrate. Therefore, the printed circuit board 1000 may be a coreless printed circuit board The via 800 is formed by penetrating or etching the core 100 so as to connect the first conductive pattern 200 and/or the second conductive pattern 400 to the third conductive pattern 700. That is, as the via 800 is made of an electrically conductive material and penetrates through the core 100 and to connect the first conductive pattern 200 and/or the second conductive pattern 400 to the third conductive pattern 700. The an IC chip and/or substrate package may be disposed on the third conductive pattern thereby connecting the IC chip and/or substrate package with the first conductive pattern 200 and/or the second conductive pattern 400 through the via 800.

As only an example, the via 800 in FIG. 1 connects the first conductive pattern 200 to the second connection pad 720 and the description is not limited thereto. The via 800 may instead connect the first conductive pattern 200 to the first connection pad 710. In another example, the via 800 may electrically connect the second conductive pattern 400 with the first connection pad 710 and/or the second connection pad 720.

In an example, a printed circuit board 1001 further includes a post-treatment layer formed on the protective layer 600. The post-treatment layer includes the adhesive layer 10 and the color layer 20.

The adhesive layer 10 is formed between the protective layer 600 and the color layer 20 so as to attach the color layer 20 to the protective layer 600. By including carbon black and/or iron oxide, the adhesive layer 10 may be black. In the case where the adhesive layer 10 is black, the color of the color layer 20 may be appear more vivid to a user. The adhesive layer 10 may disperse the carbon black and/or iron oxide in an epoxy resin.

The color layer 20 is formed on the protective layer 600. The color layer 20 may contain various colors of dye to provide an image having a variety of colors to a user.

Figure 4:
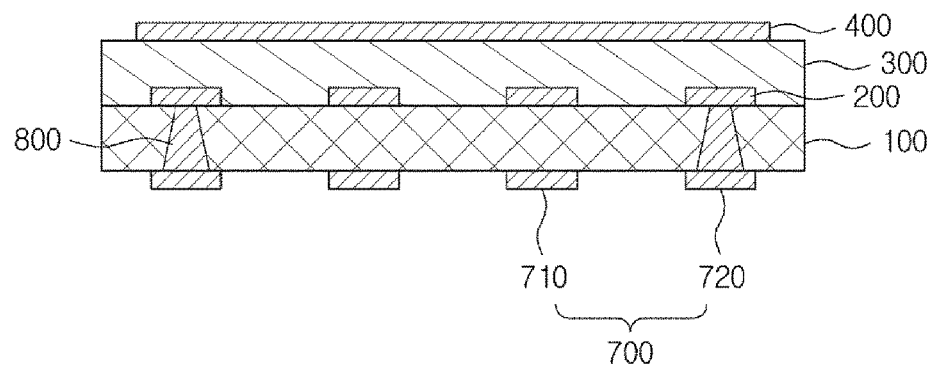
FIG. 4 through FIG. 6 are processes of a method of manufacturing a printed circuit board by illustrating cross-sectional views of the printed circuit board during the manufacturing process.
Figure 5:
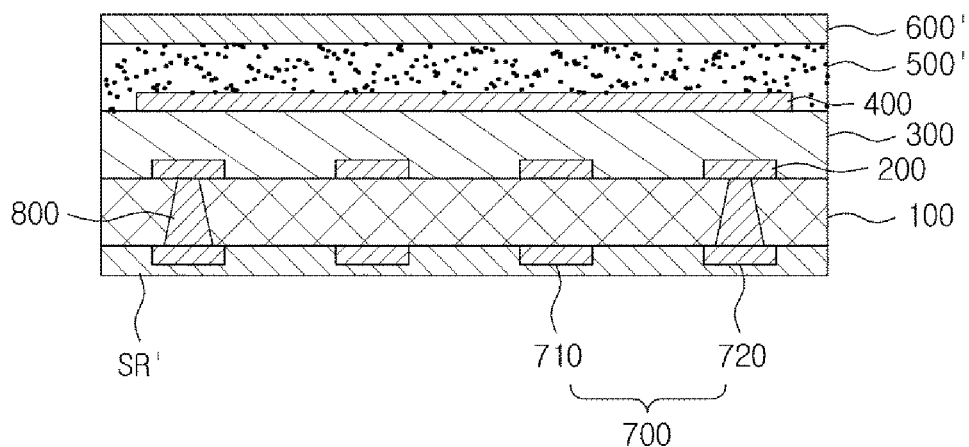
Figure 6:
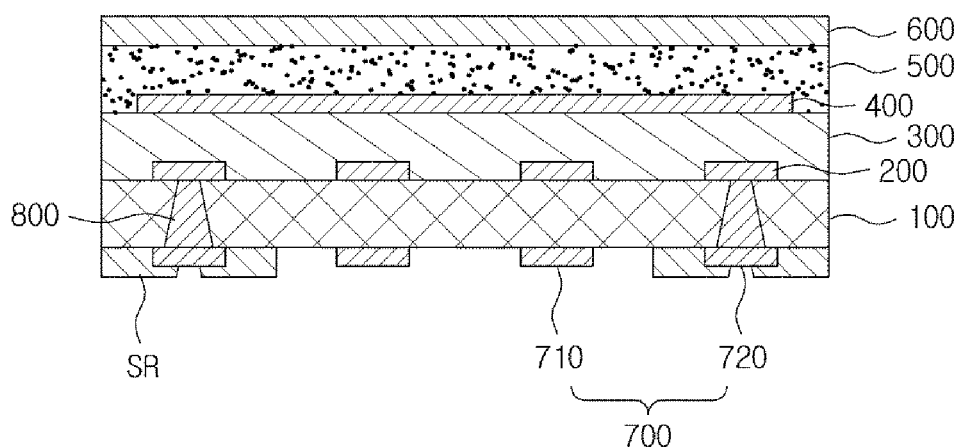

FIG. 4 to FIG. 6 illustrate processes of a method of manufacturing a printed circuit board through cross-sectional views of the printed circuit board during the manufacturing process.

Referring to FIG. 4, the method of manufacturing a printed circuit board according to an example includes forming a first conductive pattern 200, a third conductive pattern 700 and a via 800 on and in a core 100, forming an insulating layer 300 on the first conductive pattern 200 and forming a second conductive pattern 400 on the insulating layer 300.

The first conductive pattern 200, the third conductive pattern 700 and the via 800 are formed on and in the core. Specifically, a via hole may be machined or etched into the core 100, which may be a prepreg core. The first conductive pattern 200, the third conductive pattern 700 and the via 800 may be formed on and in the core 100 by electroless plating or electroplating a surface of the core 100, including an inside surface of the via hole. In another example, the first conductive pattern 200, the third conductive pattern 700 and the via 800 may be formed on and in the core 100 by selectively etching and plating the core 100 with a copper clad laminate (CCL). In another example, the first conductive pattern 200, the third conductive pattern 700 and the via 800 may be formed on and in the core 100 by machining a via hole in a metal plate, forming an insulating film on a surface of the core 100 including the inside surface of the via hole and then performing electroless plating and electroplating on the insulating film.

The insulating layer 300 is formed on the first conductive pattern 200. The insulating layer 300 may be formed by laminating an insulating film in a semi-hardened state (B-stage) on the first conductive pattern 200. That is, the insulating layer 300 may be formed by arranging the insulating film on the first conductive pattern 200 and then pressing and heating the insulating film. The method of forming the insulating film 300 described herein is only an example, and the insulating film 300 may be formed using various other methods, for example, spin-coating.

After the insulating layer 300 is formed, the second conductive pattern 400 is formed on the insulating layer 300. The second conductive pattern 400 may be formed through the subtractive process and the additive process, for example. As described above, the second conductive pattern 400 is formed to extend perpendicular to the first conductive pattern 200.

Referring to FIG. 5 and FIG. 6, the method of manufacturing a printed circuit board according to an example includes forming a dielectric layer and a protective layer on the second conductive pattern and forming a solder resist layer on the third conductive pattern.

Referring to FIG. 5, a dielectric film 500' in B-stage and a photosetting film 600' in B-stage are formed on the second conductive pattern, and a solder resist film SR' is formed on the third conductive pattern. Specifically, the dielectric film 500' and the photosetting film 600' are formed on the side of one side of the core 100, and the solder resist film SR' is formed on another side of the core 100.

The dielectric film 500', the photosetting film 600' and the solder resist film SR' become the dielectric layer 500, the protective layer 600 and the solder resist layer SR, respectively, through a follow-up light exposure processes.

As illustrated in FIG. 6, after forming the protective layer 600 and the solder resist layer SR by exposing the photosetting film 600' and the solder resist film SR', respectively, to light, the dielectric layer 500 is formed by heat-curing the dielectric film 500'.

In order to pattern the solder resist film SR', it is required to introduce a step of photo-curing particular portions of the solder resist film SR' by exposing the solder resist film SR' to light. In this step, the photosetting film 600' may be photo-cured and become the protective layer 600. As a result, it is possible to prevent the B-stage dielectric film 500' from being externally exposed and being damaged by foreign objects.

Thereafter, although not illustrated, a post-treatment layer including an adhesive layer 10 and a color layer 20 are formed on the protective layer 600.

As a non-exhaustive example only, a device as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device capable of wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a fingerprint sensor, comprising:
    forming a first conductive pattern, a third conductive pattern, and a via on a core;
    forming an insulating layer on the first conductive pattern;
    forming a second conductive pattern on the insulating layer;
    forming a dielectric layer on the second conductive pattern such that a first surface of the dielectric layer is disposed on the second conductive pattern;
    forming a protective layer on a second surface of the dielectric layer opposite the first surface of the dielectric layer; and
    forming a solder resist layer on the third conductive pattern,
    wherein the forming of the solder resist layer on the third conductive pattern comprises coating a solder resist material on the third conductive pattern and exposing the solder resist material to light,
    wherein the forming of the protective layer on the second surface of the dielectric layer opposite the first surface of the dielectric layer comprises forming a photosetting material on the dielectric film, and exposing the photosetting material to light, and
    wherein the forming of the dielectric layer on the second conductive pattern comprises forming a dielectric film in B-stage on the second conductive pattern, and heat-curing the dielectric film after the exposing of the photosetting material to light.

2. The method of claim 1, wherein the solder resist material comprises a solder resist film, and the photosetting material comprises a B-stage film.

3. The method of claim 1, further comprising, after the forming of the solder resist layer, forming an adhesive layer and a color layer successively on the protective layer.

4. The method of claim 1, wherein the exposing of the photosetting material to light is performed during the exposing of the solder resist material to light.

5. A method of manufacturing a fingerprint sensor, comprising:
    forming a first conductive pattern on a first surface of a core;
    forming an insulating layer on the first conductive pattern;
    forming a second conductive pattern on the insulating layer;
    forming a dielectric film on the second conductive pattern such that a first surface of the dielectric film is disposed on the second conductive pattern;
    forming a third conductive pattern on a second surface of the core;
    forming a solder resist layer on the third conductive pattern by disposing a solder resist film on the third conductive pattern and photo-curing the solder resist film;
    forming a protective layer on the dielectric film by disposing a photosetting film on a second surface of the dielectric film opposite the first surface of the dielectric film, and photo-curing the photosetting film; and
    heat-curing the dielectric film after the forming of the protective layer.

6. The method of claim 5, wherein the photo-curing of the photosetting film is performed during the photo-curing of the solder resist film.

* * * * *